US011217550B2

(12) United States Patent
Gandhi et al.

(10) Patent No.: US 11,217,550 B2
(45) Date of Patent: Jan. 4, 2022

(54) CHIP PACKAGE ASSEMBLY WITH ENHANCED INTERCONNECTS AND METHOD FOR FABRICATING THE SAME

(71) Applicant: Xilinx, Inc., San Jose, CA (US)

(72) Inventors: Jaspreet Singh Gandhi, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 330 days.

(21) Appl. No.: 16/044,363

(22) Filed: Jul. 24, 2018

(65) Prior Publication Data

US 2020/0035635 A1 Jan. 30, 2020

(51) Int. Cl.
*H01L 23/00* (2006.01)
*H01L 21/3065* (2006.01)
*H01L 21/78* (2006.01)

(52) U.S. Cl.
CPC .......... *H01L 24/17* (2013.01); *H01L 21/3065* (2013.01); *H01L 21/78* (2013.01); *H01L 24/09* (2013.01); *H01L 24/14* (2013.01); *H01L 24/81* (2013.01); *H01L 2224/0401* (2013.01); *H01L 2224/81002* (2013.01); *H01L 2924/3512* (2013.01)

(58) Field of Classification Search
CPC . H01L 2224/81002; H01L 2224/81013; H01L 2224/8101; H01L 2224/81022; H01L 2224/8291; H01L 2224/8201; H01L 2224/81913; H01L 2224/81891; H01L 2224/81355; H01L 2224/81009; H01L 2224/1181; B23K 2101/40
See application file for complete search history.

(56) References Cited

U.S. PATENT DOCUMENTS

| 4,921,157 | A | * | 5/1990 | Dishon | B23K 1/00 228/124.1 |
| 5,244,144 | A | * | 9/1993 | Osame | B23K 1/008 148/26 |
| 5,407,121 | A | * | 4/1995 | Koopman | B23K 1/20 228/206 |
| 5,499,754 | A | * | 3/1996 | Bobbio | B23K 1/20 228/42 |
| 5,516,031 | A | * | 5/1996 | Nishikawa | B23K 1/0016 228/205 |

(Continued)

OTHER PUBLICATIONS

Disco Corporation, "Laser Application", Aug. 2017, 10 pages, www.disco.co.jp.

(Continued)

*Primary Examiner* — David A Zarneke
(74) *Attorney, Agent, or Firm* — Patterson + Sheridan, LLP

(57) ABSTRACT

An integrated circuit interconnects are described herein that are suitable for forming integrated circuit chip packages. In one example, an integrated circuit interconnect is embodied in a wafer that includes a substrate having a plurality of integrated circuit (IC) dice formed thereon. The plurality of IC dice include a first IC die having first solid state circuitry and a second IC die having second solid state circuitry. A first contact pad is disposed on the substrate and is coupled to the first solid state circuitry. A first solder ball is disposed on the first contact pad. The first solder ball has a substantially uniform oxide coating formed thereon.

20 Claims, 20 Drawing Sheets

(56) References Cited

U.S. PATENT DOCUMENTS

| | | | | |
|---|---|---|---|---|
| 5,609,290 | A * | 3/1997 | Bobbio | B23K 1/20 228/206 |
| 5,615,825 | A * | 4/1997 | Bobbio | B23K 35/38 228/206 |
| 6,013,381 | A * | 1/2000 | Bobbio | B23K 1/203 257/E21.511 |
| 6,092,714 | A * | 7/2000 | Casey | B23K 1/206 228/205 |
| 6,250,540 | B1 * | 6/2001 | Egitto | B23K 1/206 228/205 |
| 6,604,672 | B2 * | 8/2003 | Mori | C03C 27/04 228/208 |
| 7,906,425 | B2 * | 3/2011 | Su | H01L 24/11 257/E23.021 |
| 8,096,140 | B2 * | 1/2012 | Seem | F24F 11/0001 62/186 |
| 8,237,276 | B2 * | 8/2012 | Song | H01L 24/03 257/737 |
| 8,492,242 | B2 * | 7/2013 | Fay | H01L 24/29 228/123.1 |
| 8,567,658 | B2 * | 10/2013 | Schulte | H01L 24/11 228/180.22 |
| 9,601,437 | B2 | 3/2017 | Albermann et al. | |
| 2009/0191690 | A1 | 7/2009 | Boyle et al. | |
| 2011/0014785 | A1 * | 1/2011 | Shimizu | C23C 8/12 438/613 |
| 2012/0052677 | A1 * | 3/2012 | Zenner | B23K 35/0244 438/613 |
| 2015/0371962 | A1 * | 12/2015 | Akamatsu | H01L 24/13 257/737 |

OTHER PUBLICATIONS

SPTS Technologies Ltd., "XeF2 Etch for MEMS Release", Application Brief, Ref XeF2-Intro-Q3/14, 2014, 2 pages, https://www.orbotech.com/imgs/uploads/a-soulution-tech/XeF2-Intro-A4.pdf.

SPTS Technologies Ltd., "XeF2 Etch for MEMS Release", Application Brief, Ref XeF2-Intro-Q1/16, 2016, 2 pages.

* cited by examiner

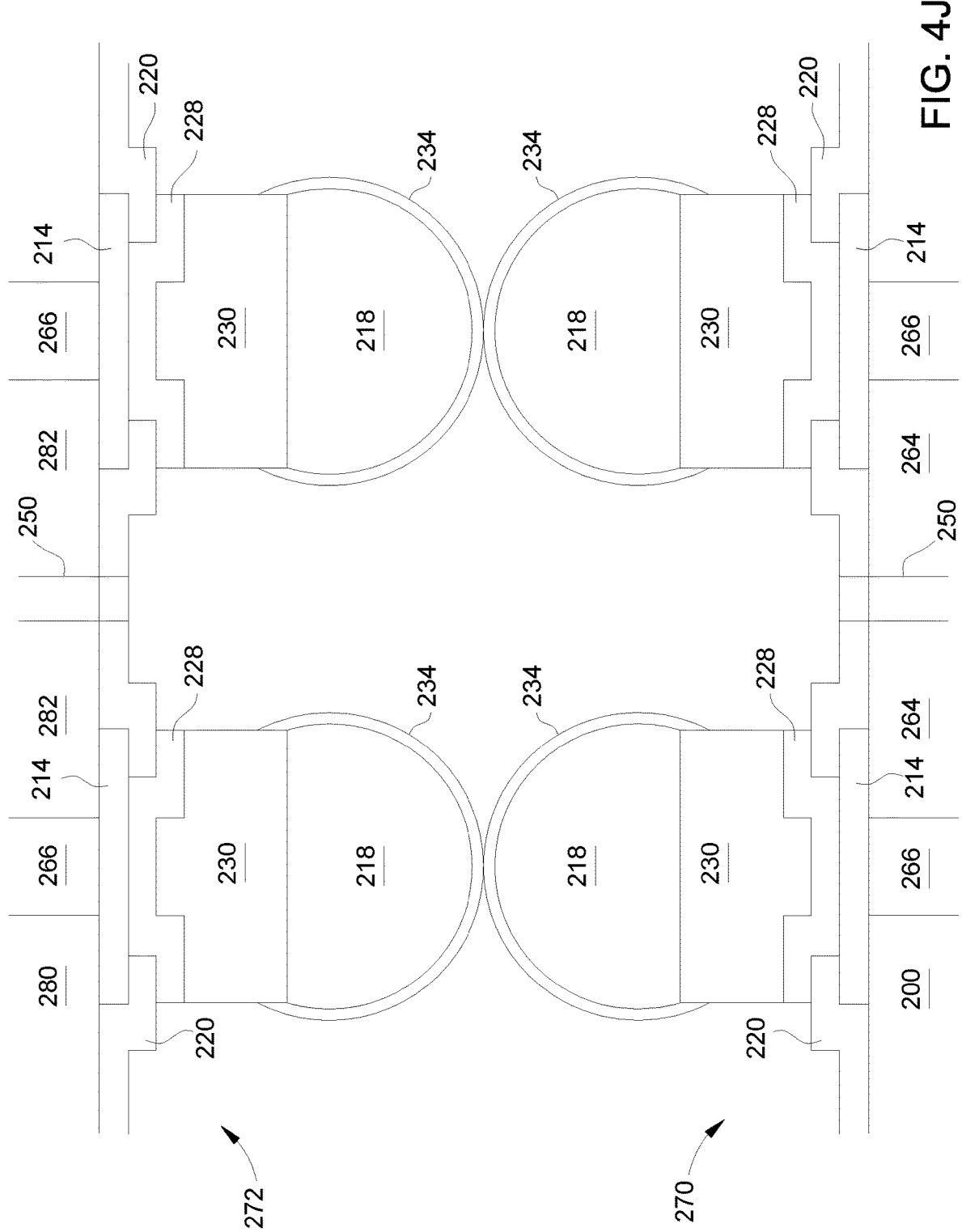

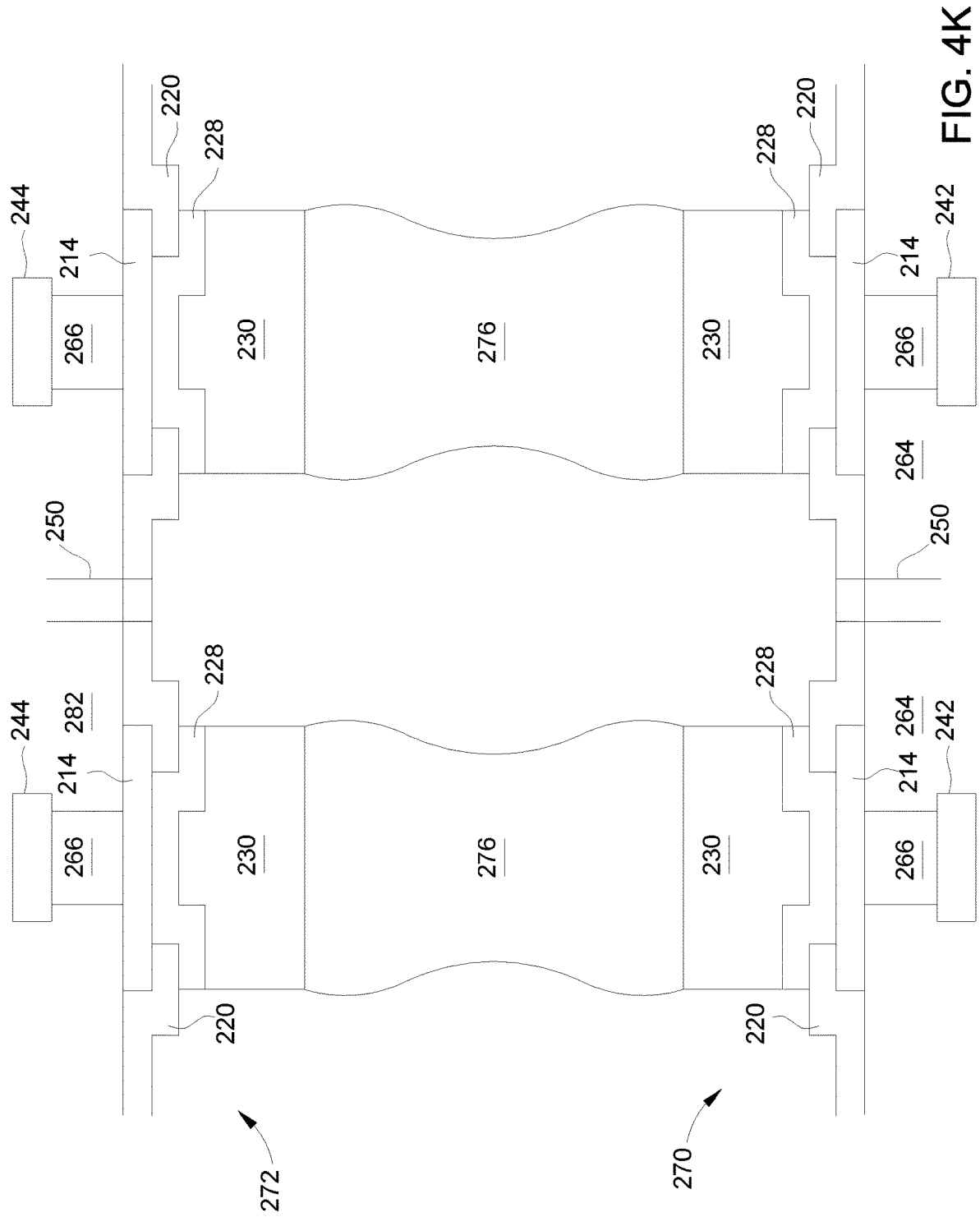

CHIP PACKAGE ASSEMBLY WITH ENHANCED INTERCONNECTS AND METHOD FOR FABRICATING THE SAME

BACKGROUND OF THE INVENTION

Field of the Invention

Implementations described herein generally relate to chip packaging, and in particular, to solder bump structures for a semiconductor device and methods of fabricating the same.

Description of the Related Art

An increasing demand for electronic equipment that is smaller, lighter, and more compact has resulted in a concomitant demand for semiconductor packages that have smaller outlines and mounting areas or "footprints." One response to this demand has been the development of the "flip-chip" method of attachment and connection of semiconductor chips or "dice" to substrates (e.g., PCBs or lead-frames). Flip-chip mounting involves the formation of bumped contacts (e.g., solder balls) on the active surface of the die, then inverting or "flipping" the die upside down and reflowing the bumped contacts (i.e., heating the bumped contacts to the melting point) to form solder joints fusing the bumped contacts to the corresponding pads on the substrate.

In flip-chip mounting and connection methods, thermomechanical reliability is becoming an increasing concern of the electronics industry. Notably, the reliability of the integrated circuit interconnects, e.g., solder joints, is one of the most critical issues for successful application of such mounting and connection methods. However, solder joints formed using known methods are susceptible to oxidation during fabrication, which degrades the electrical and mechanical properties of the solder joint. Additionally, conventional solder joints are also prone to necking as solder wicks away from the solder joint, which may lead to cracking of the solder joint. Forming a robust solder connections between dice utilized in semiconductor packages is particularly challenging at such small pitches due to the differences in thermal expansion which present an undesirably high risk for cracking at high-stress points due to thermal stress cycling.

Therefore, there is a need for improved integrated circuit interconnects and methods of forming improved solder joints for an integrated circuit.

SUMMARY

An integrated circuit interconnects are described herein that are suitable for forming integrated circuit chip packages. In one example, an integrated circuit interconnect is embodied in a wafer that includes a substrate having a plurality of integrated circuit (IC) dice formed thereon. The plurality of IC dice include a first IC die having first solid state circuitry and a second IC die having second solid state circuitry. A first contact pad is disposed on the substrate and is coupled to the first solid state circuitry. A first solder ball is disposed on the first contact pad. The first solder ball has a substantially uniform oxide coating formed thereon.

In another example, an integrated circuit interconnect is embodied in a method that includes depositing a solder ball on a pillar coupled to first circuitry formed in a first substrate, exposing the solder ball to an oxygen containing environment to form an oxidation layer on the solder ball, and converting the oxidation layer on the solder ball to form a non-oxide solder protection layer on the solder ball.

In yet another example, an integrated circuit interconnect is embodied in a method that includes depositing a solder ball on a pillar coupled to first circuitry of a first integrated circuit (IC) die formed in a first substrate, exposing the solder ball to an oxygen containing environment to form an oxidation layer on the solder ball, removing native oxides from the solder balls prior to forming the oxidation layer, converting the oxidation layer on the solder ball to form a non-oxide solder protection layer on the solder ball, attaching the solder ball coupled to first circuitry formed in the first IC die to a second IC die, and reflowing the solder ball to remove the non-oxide solder protection layer. Reflowing the solder ball also mechanically and electrically connect the first IC die to the second IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4K are sequential views of a chip package during different stages of the method of FIG. 3.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosed technology generally provide an improved solder interconnect for connecting integrated circuit (IC) dice of chip packages, and methods for forming the same. The solder interconnects of the IC dice are coated with a substantially uniform oxide layer that is converted to a non-oxide protection layer prior to reflow. The non-oxide protection layer advantageously has a melting temperature less than the solder reflow temperature, thus enabling reflow without a separate operation for removal of the protection layer while providing robust protection of the solder against native oxide formation prior to reflow. In some examples, the non-oxide protection layer may be formed simultaneously with an etch dicing operation, further simplifying process flows and providing economy of fabrication. In the description below, the improved solder interconnect is illustrated between one IC die stacked with another IC die. However, the improved solder interconnect may also be utilized on solder connects coupling an IC die to a package substrate, for coupling an interposer to a package substrate, an interposer and an IC die, or for other solder connections. In particular, solder interconnects described herein enables flux-free solder interconnect formation, which reduces the probability of solder necking and cracking during reflow. Less wicking results on more solder volume being retained within the solder ball, making a more robust and crack resistance electrical and mechanical connection. Additionally, the solder ball protection layer protects the solder ball from oxidation, and thus, yields a more robust and reliable electrical connection.

Figure 1:
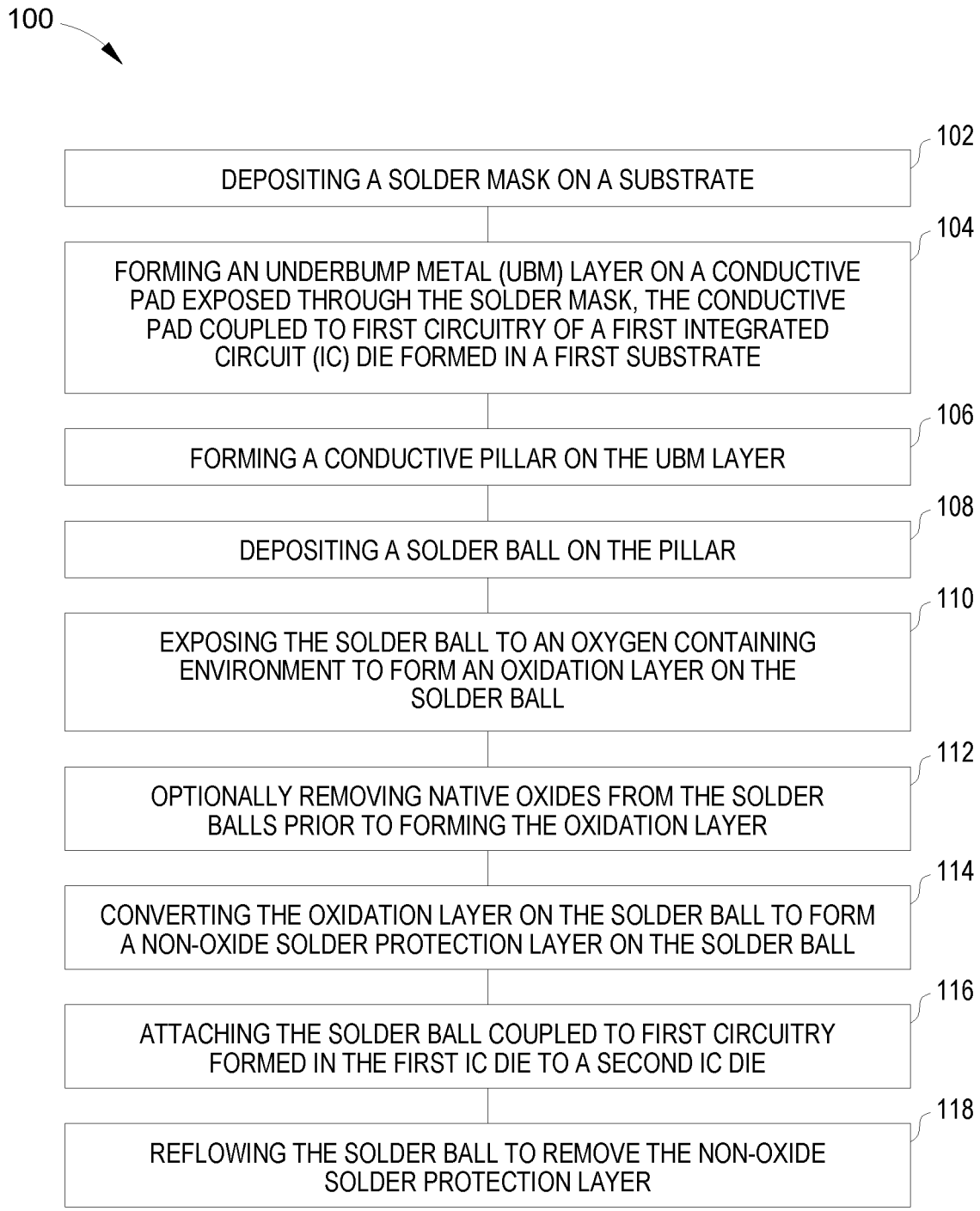
FIG. 1 is a flow diagram of a method for forming a chip package that incorporates an IC solder interconnect.

FIG. 1 is a flow diagram of one example of a method 100 of forming an improved solder interconnect that may be ultimately embodied in a chip package assembly of other device coupled through solder interconnects. FIGS. 2A-2H correspond to a chip package assembly during different stages of the method 100.

Figure 2A:
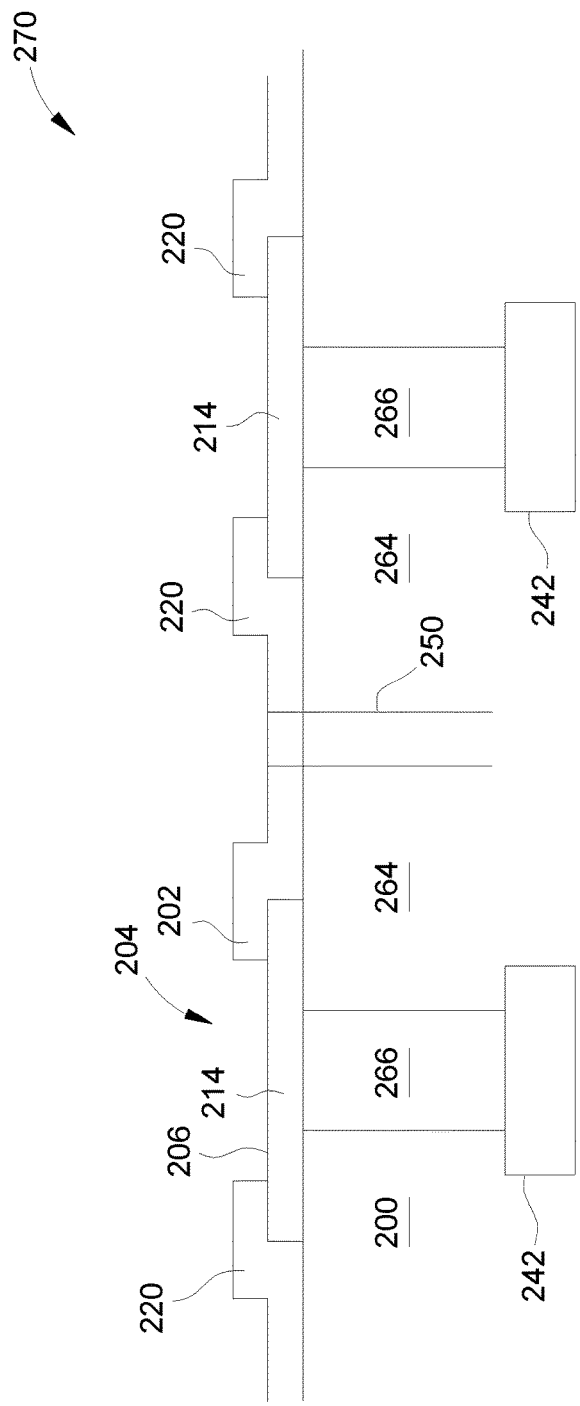
FIGS. 2A-2H are sequential views of a chip package during different stages of the method of FIG. 1.

Referring now to FIG. 1 and FIG. 2A, the method 100 begins at operation 102 by forming a solder mask 220 on a first substrate 200. The first substrate 200 may be wafer 270 comprising a plurality of dice, interposers or package substrates. In the example depicted in FIG. 2A, the first substrate 200 includes a plurality of dice 264 separated by scribe lanes 250. The scribe lanes 250, shown in phantom, are regions of the first substrate 200 typically containing no circuitry where the first substrate 200 is cut through to separate the individual die 264 from each other. Each die 264 has a plurality of conductive contact pads 214 that are coupled by conductive routing 266 to first solid state circuitry 242 of the die 264. The first solid state circuitry 242 of the die 264 may be configured as logic devices, such as field programmable gate arrays (FPGA), memory devices, optical devices, processors or other IC logic structures.

The solder mask 220 may be a photoimageable material, such as acrylic or polyimide plastic photoimageable materials, liquid photoimageable materials, dry photoimageable films. Alternatively, the solder mask 220 may be an epoxy resin that is silk screened or spin-coated on the first substrate. In the example depicted in FIG. 2A, a solder mask 220 includes an opening 204 through which a portion of a top surface 206 of the conductive contact pad 214 is exposed. The conductive contact pad 214 is coupled to first circuitry 242 of an integrated circuit (IC) die 264 disposed on the substrate 200. The opening 204 may be formed in the photoimageable material comprising the solder mask 220 using photolithography techniques. A portion 202 of the solder mask 220 is disposed on the top surface 206 and bounds the opening 204 so that the side surfaces of the contact pad 214 are completely covered by the solder mask 220.

Figure 2B:
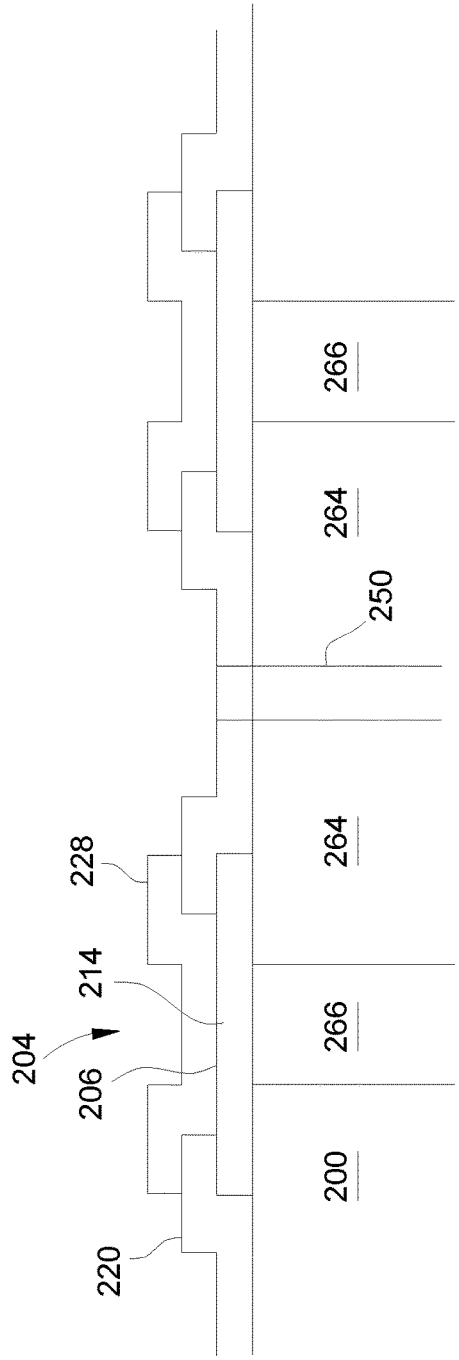

At operation 104, an optional underbump metal (UBM) layer 228 is formed on the conductive contact pad 214 exposed through the opening 204 formed through solder mask 220 as shown in FIG. 2B. The UBM layer 228 includes one or more of an adhesion layer, a barrier layer and a conductive seed layer. The UBM layer 228 may be fabricated from one or more layers of titanium, titanium tungsten (TiW), nickel (Ni), nickel vanadium (NiV), chromium (Cr) and copper (Cu). The UBM layer 228 may be deposited by plating, electrochemical ECP plating, electroless plating, physical vapor deposition (PVD) or other suitable process.

Figure 2C:
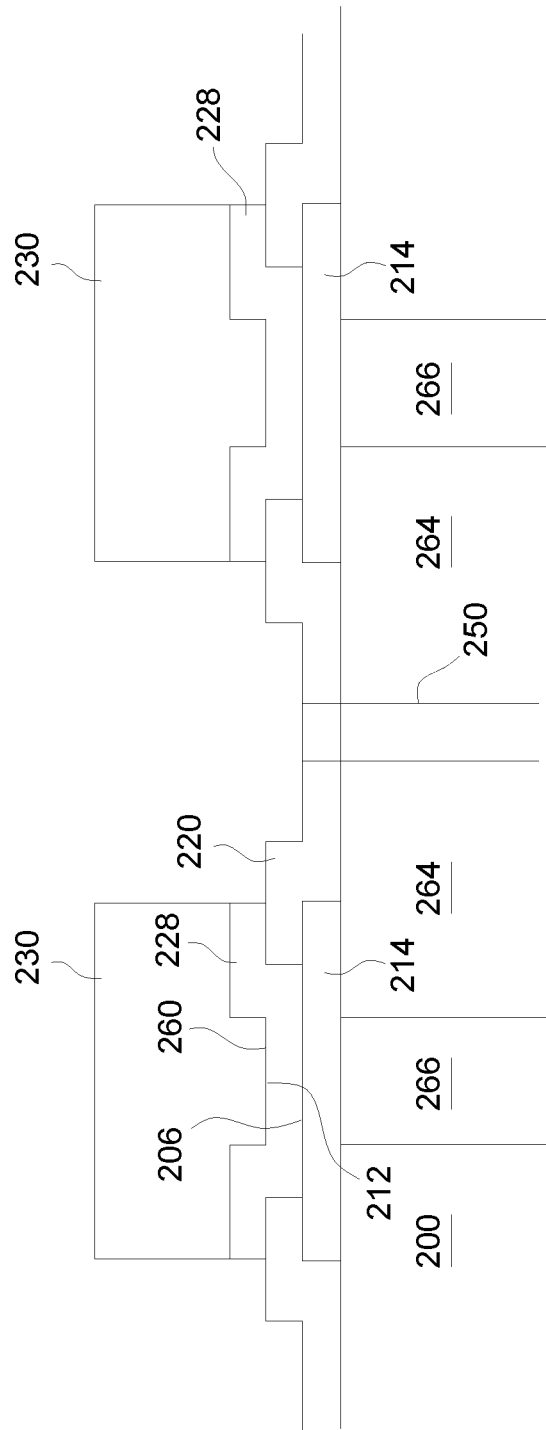

At operation 106, a conductive pillar 230 is formed on the UBM layer 228 as shown in FIG. 2C. If the UBM layer 228 is not present, the conductive pillar 230 is formed directly on exposed top surface 206 of the contact pad 214 exposed through the opening 204 formed in the solder mask 220. The conductive pillar 230 may be fabricated from copper or other suitable conductive material. The conductive material comprising the pillar 230 may be deposited using a plating, PVD or other suitable process. The conductive pillar 230 may optionally include a plating layer. The plating layer may be formed from at least one of copper and nickel, among other materials.

The conductive pillar 230 includes a bottom surface 260 that is formed directly on a surface 212 the UBM layer 228 facing away from the contact pad 214. Alternatively, the bottom surface 260 of the conductive pillar 230 may alternatively be formed directly on the exposed top surface 206 of the contact pad 214 in embodiments that do not include the UBM layer 228.

Figure 2D:
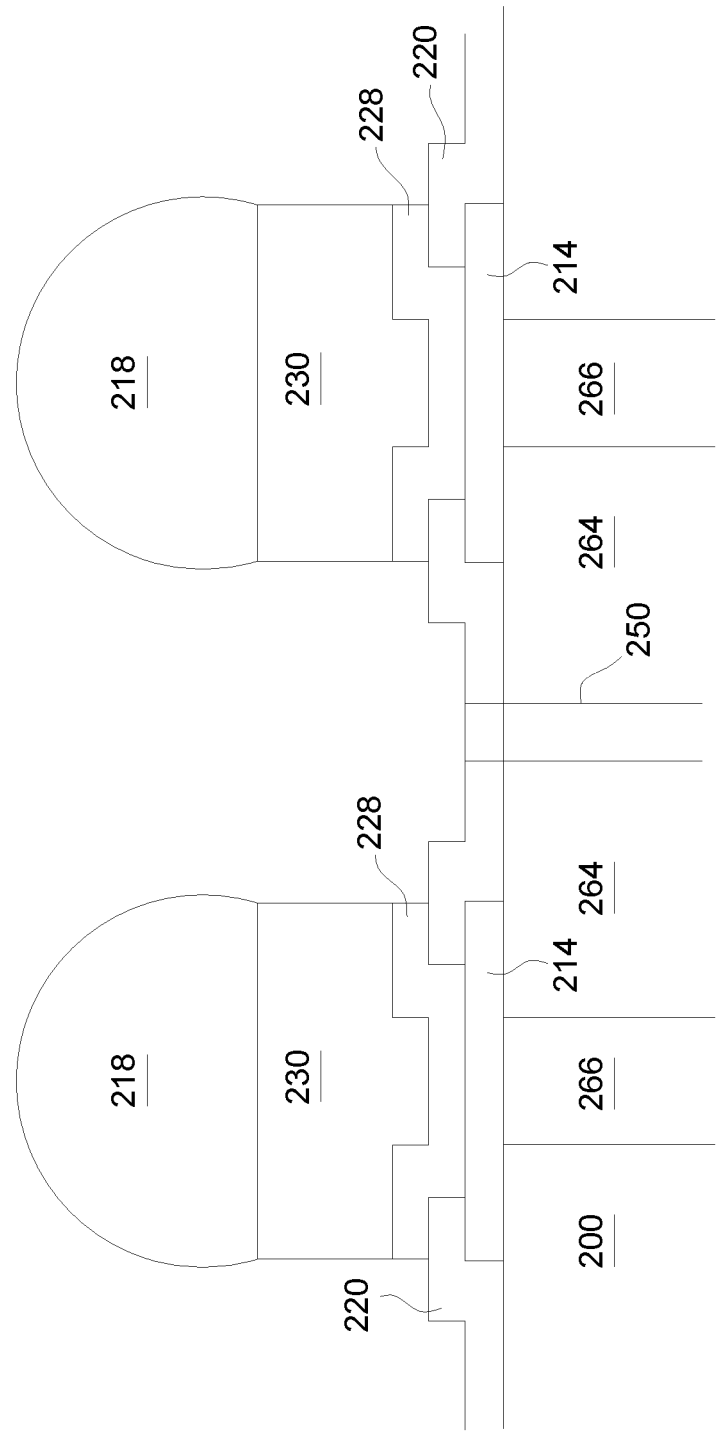

At operation 108, a solder ball 218 is deposited on the conductive pillar 230 coupled to the first circuitry of the IC die 264 formed on the first substrate 200, as illustrated in FIG. 2D. The solder ball 218 may be deposited by screen printing or other suitable technique.

Figure 2E:
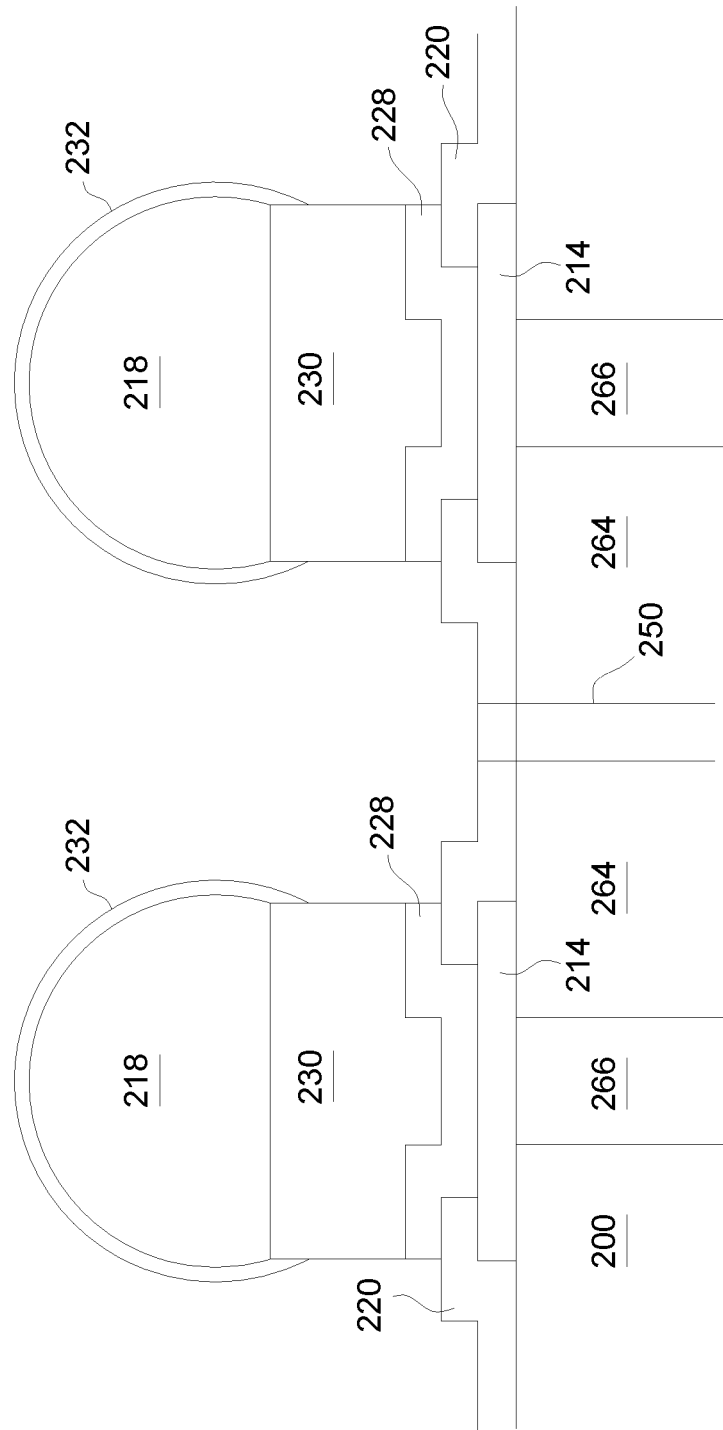

At operation 110, the solder balls 218 are exposed to an oxygen containing environment to form an oxidation layer (e.g., oxide coating) 232 on the solder balls 218, as illustrated in FIG. 2E. In one example, the oxygen containing environment is an oxygen containing plasma. The oxygen containing plasma may be formed by energizing an oxygen containing gas, such as oxygen, ozone, and water, among others. The oxygen containing environment forms a thick oxide coating (e.g., the oxidation layer 232), such as $SnO_2$, uniformly around the solder ball 218. In one example, the oxidation layer 232 formed on the solder ball 218 is at least 4 μm thick, such as between 5 μm and at least 7 μm thick. The oxidation layer 232 inhibits native oxides from forming on the solder ball 218. Native oxides hinder wettability and impact the mechanical and electrical connections of the solder joint. Formation of some native oxide is inevitable, and when present, the undesired native oxide is typically very non-uniform and also very thin. Thus, the process control required to obtain a uniform oxidation layer 232 and ultimately a uniform non-oxide protection layer is challenging when native oxides are present. Moreover, the presence of native oxides also shields the solder ball from the oxide layer 232 such that less reacting species (e.g., Sn) is available to convert to oxide layer to the non-oxide protection layer. Although forced or intentional oxidation can be done without removing the native oxide, removing the native oxide yields a more robust and reliable solder joint.

At an optional operation 112, native oxides are removed from the solder balls 218 prior to forming the oxidation layer 232 at operation 110. Native oxides, when present on the solder ball 218, generally are less than about 2 μm thick, and generally do not uniformly cover the exterior of the solder ball 218, often even leaving a portion of the solder material comprising the solder ball 218 exposed. Native oxides may be removed by mechanical scrubbing, reducing oxides with liquid flux, and exposing the solder ball 218 to a reducing gas, such as forming gas or formic acid vapor, among other suitable techniques. By removing native oxides prior to the formation of the oxidation layer 232, a more robust and reliable electrical and mechanical interconnect may be formed as further discussed below.

Figure 2F:
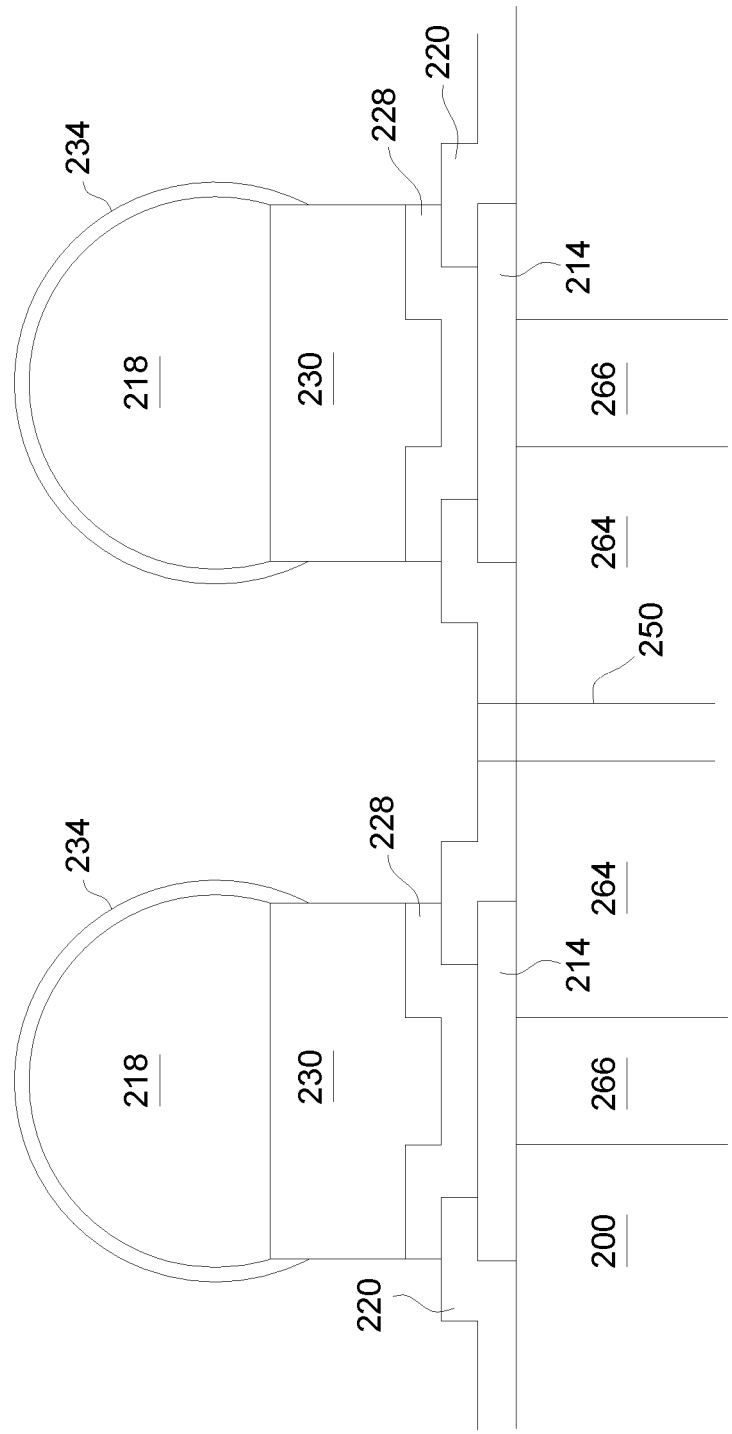

At operation 114, the oxidation layer 232 on the solder ball 218 is converted to form a non-oxide solder protection layer 234 on the solder ball 218, as illustrated in FIG. 2F. If operation 112 has been performed, then substantially no native oxides are present between the solder ball 218 and non-oxide solder protection layer 234, which again provides a more robust and reliable electrical and mechanical solder interconnect.

In one example, the oxidation layer 232 is converted to the non-oxide solder protection layer 234 by exposing the oxidation layer 232 to a halogen containing gas. Suitable halogen containing gases include, but are not limited to, fluorine-containing gases, such as $SF_6$ and $XeF_2$. In one example, the halogen containing gas may be provided as a sulfur and fluorine containing gas, such as $SF_6$, or as a mixture of a fluorine containing gas and a sulfur containing gas. Optionally, the fluorine containing gas and the sulfur containing gas may be sequentially provided, with some or no overlap in the duration of the period in which each gas is provided.

The halogen containing gas may be energized while converting the oxidation layer 232. For example, the halogen containing gas may be energized to form a plasma to disassociate the halogen containing gas. In one example, plasma is utilized to provide fluorine radicals to the surface of the oxidation layer 232. The fluorine radicals replace the oxygen elements within the oxidation layer 232, thus converting the oxidation layer 232 to $SnF_N$ (e.g., the non-oxide solder protection layer 234), where N is a positive integer.

The converted non-oxide solder protection layer 234 has a thickness of at least 3 μm thick, such as between 5 μm and at least 7 μm thick. The non-oxide solder protection layer 234 is conformal to the solder ball 218, and has a substantially uniform thickness (i.e., within ±1 μm). The non-oxide solder protection layer 234 prevents undesirable oxidation of the solder balls 218 during subsequent fabrication.

Figure 2G:
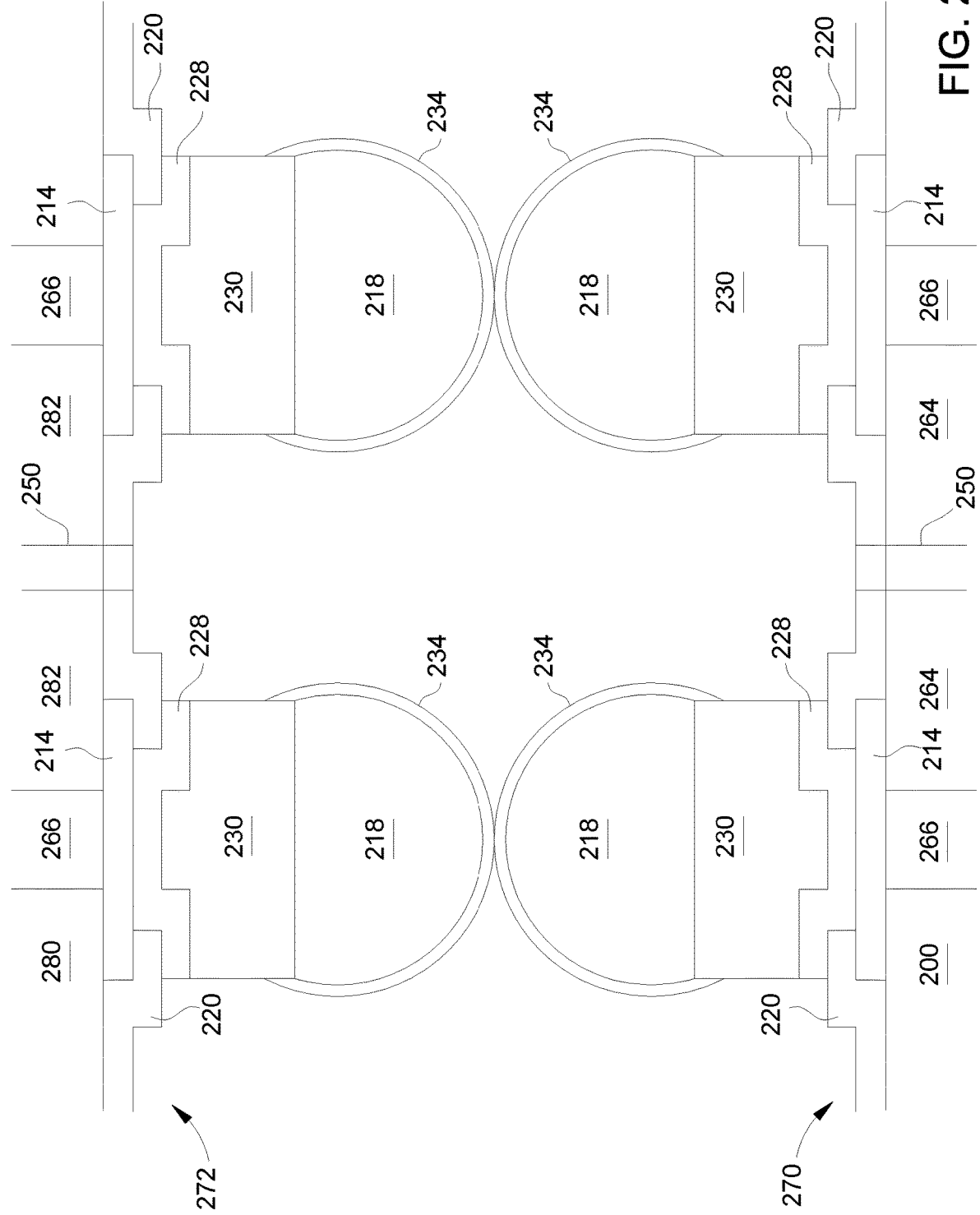

At operation 116, the solder ball 218 coupled to first circuitry 242 formed in the first IC die 264 is attached to a second IC die 282 of a second substrate 280 formed on a second wafer 272, as illustrated in FIG. 2G. In the example depicted in FIG. 2G, the solder ball 218 of the first substrate 200 is attached to a solder ball 218 coupled to second circuitry 244 formed in the second IC die 282.

Figure 2H:
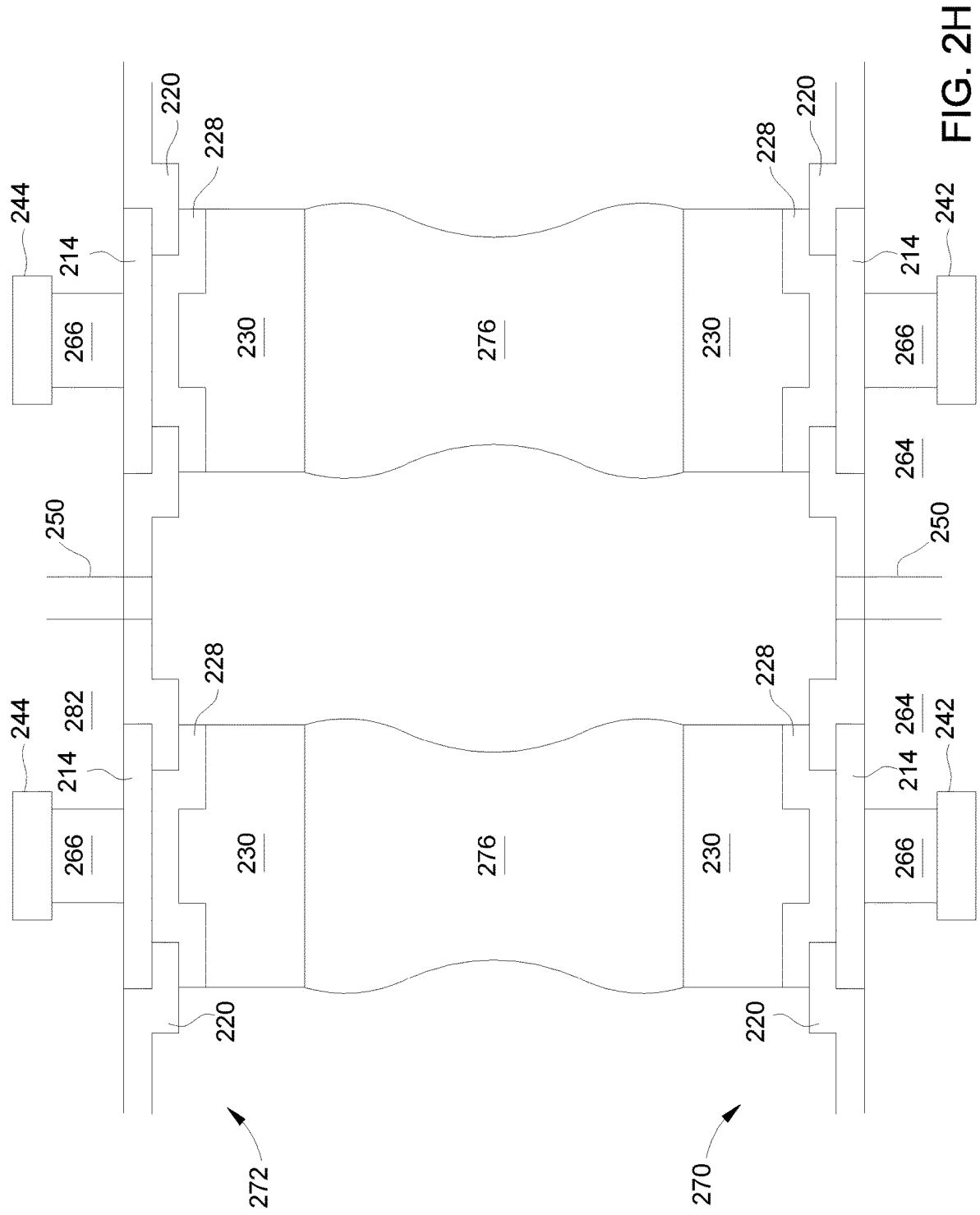

At operation 118, the solder balls 218 are reflowed to remove the non-oxide solder protection layer 234. The reflowing of the solder balls 218 additionally mechanically and electrically connect the first IC die 264 to the second IC die 282 to form a solder interconnect 276, as illustrated in FIG. 2H. For example, the non-oxide solder protection layer 234 has a melting point less than that of the solder balls 218, which is also less than the reflow temperature. Thus, as the temperature is increased during the reflow process, the non-oxide solder protection layer 234 is removed as the halogen elements within the non-oxide solder protection layer become volatile, leaving a clean, bare solder surface on the solder balls 218 which upon reflowing of the solder balls 218, provides a robust electrical and mechanical connection between the first IC die 264 and the second IC die 282 forming a chip package, such as illustrated below with reference to FIG. 5. Additionally, as operation 118 may be performed without the use of flux, the potential for solder wicking is substantially reduced, thus, significantly reducing the probability of solder joint cracking and voids, while contributing to the robust performance of the solder interconnect 276. The first and second IC dice 264, 282 are now ready for optional dicing, optional further packaging and testing.

Figure 3:
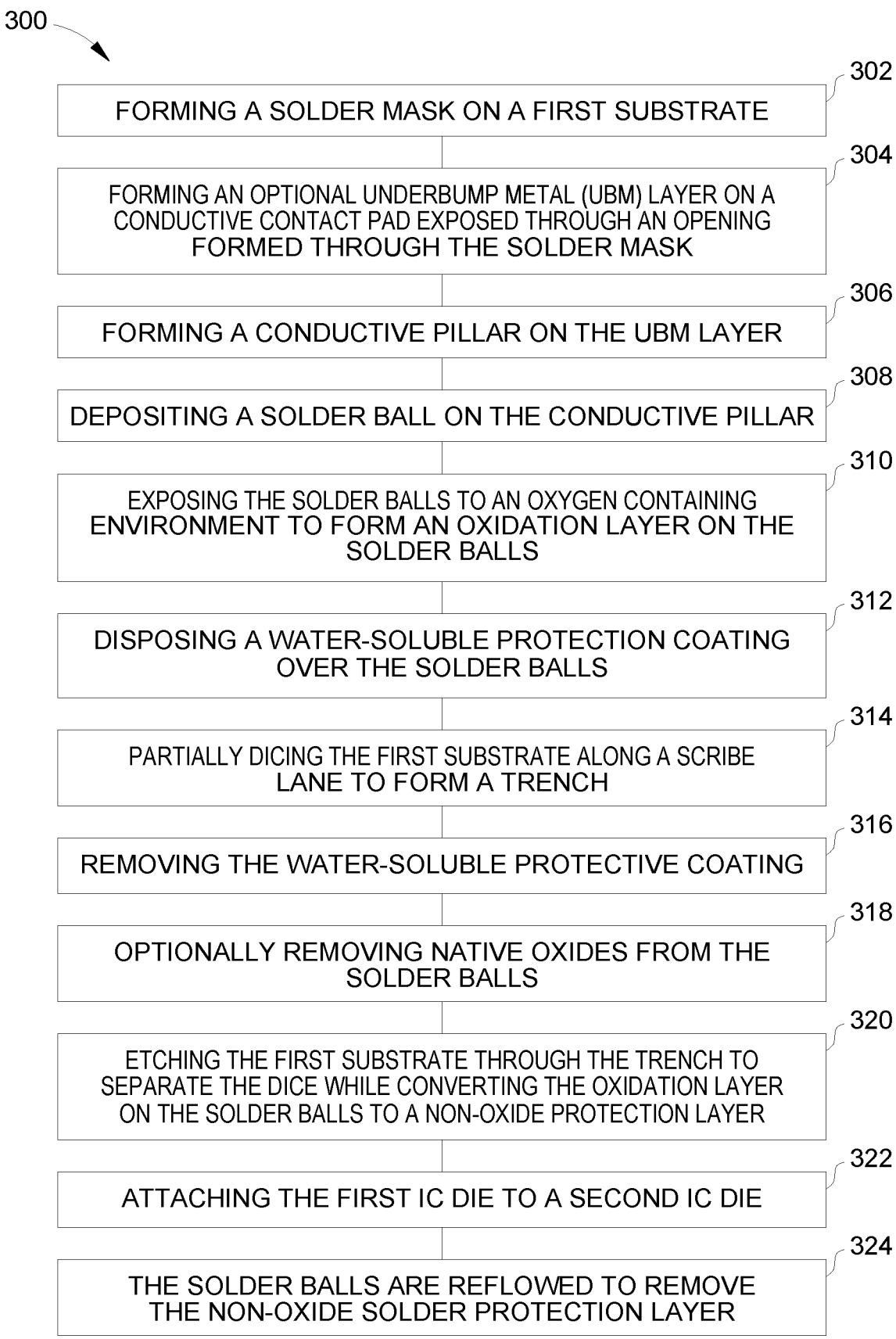
FIG. 3 is a flow diagram of another method for forming a chip package that incorporates an IC solder interconnect.

FIG. 3 depicts a flow diagram of another method 300 of forming an improved solder interconnect that may be ultimately embodied in a chip package assembly of other device coupled through solder interconnects. FIGS. 4A-4J correspond to a chip package assembly during different stages of the method 300. The method 300 is substantially similar to the method 100 described above, except wherein portions of the substrate dicing have been incorporated in the converting process.

Figure 4A:
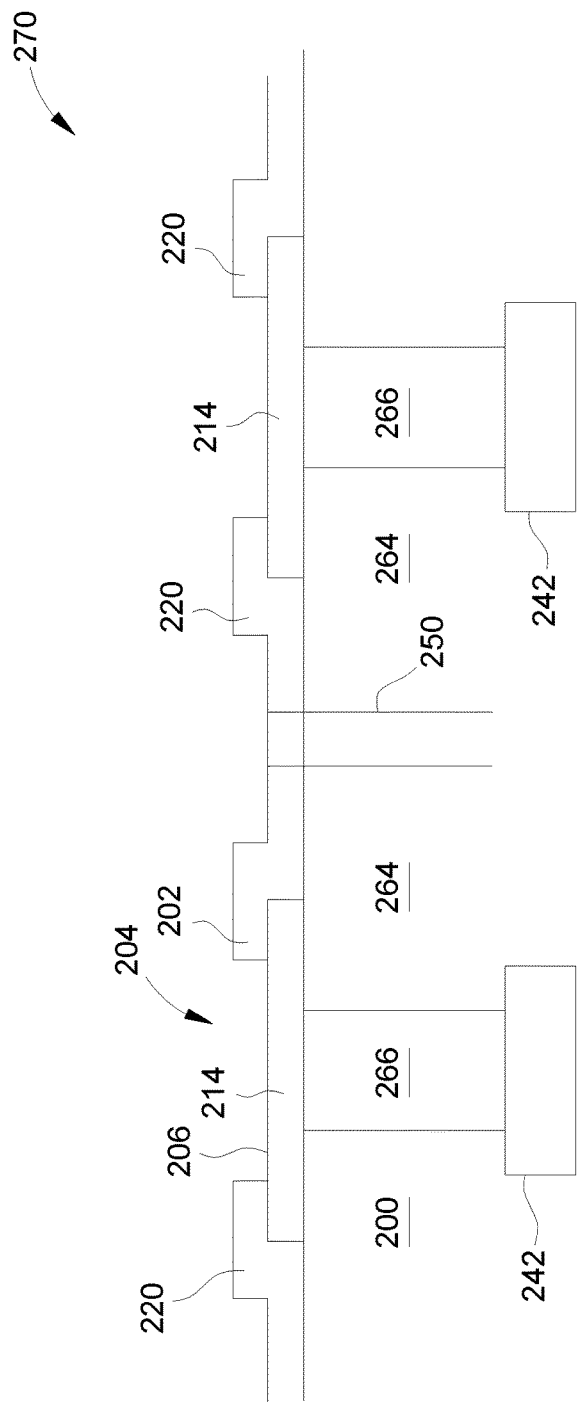

Referring now to FIG. 3 and FIG. 4A, the method 300 begins at operation 302 by forming a solder mask 220 on a first substrate 200. The first substrate 200 may be a wafer 270 comprising a plurality of dice, interposers or package substrates. In the example depicted in FIG. 4A, the first substrate 200 includes a plurality of dice 264 separated by scribe lanes 250. Each die 264 has a plurality of conductive contact pads 214 that are coupled by conductive routing 266 to first solid state circuitry 242 of the die 264.

In the example depicted in FIG. 4A, a solder mask 220 includes an opening 204 through which a portion of a top surface 206 of the conductive contact pad 214 is exposed. The conductive contact pad 214 is coupled to first circuitry 242 of an integrated circuit (IC) die 264 disposed on the substrate 200. A portion 202 of the solder mask 220 is disposed on the top surface 206 and bounds the opening 204 so that the side surfaces of the contact pad 214 are completely covered by the solder mask 220.

Figure 4B:
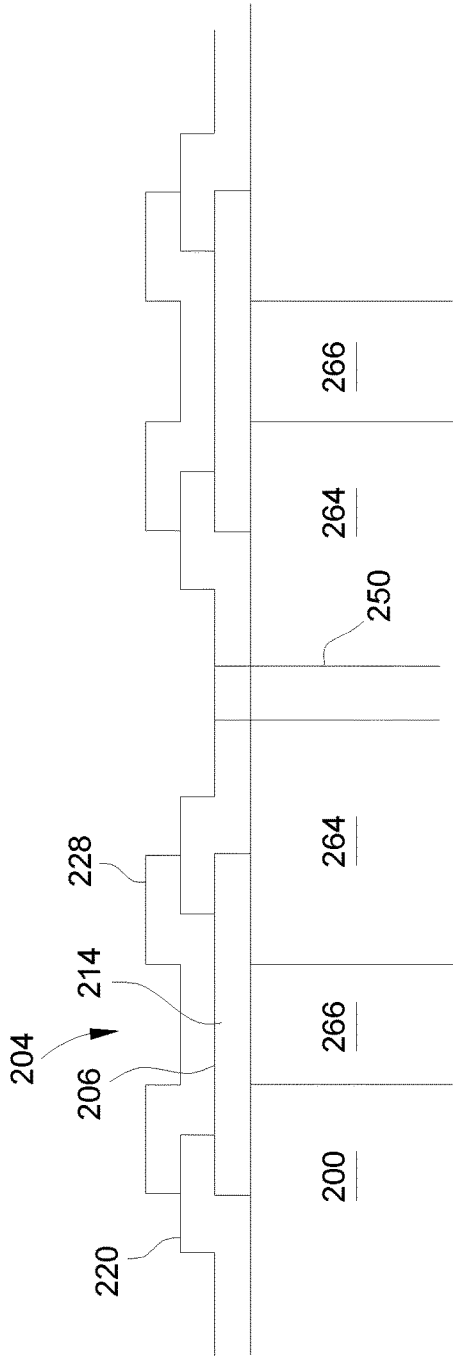
Figure 4C:
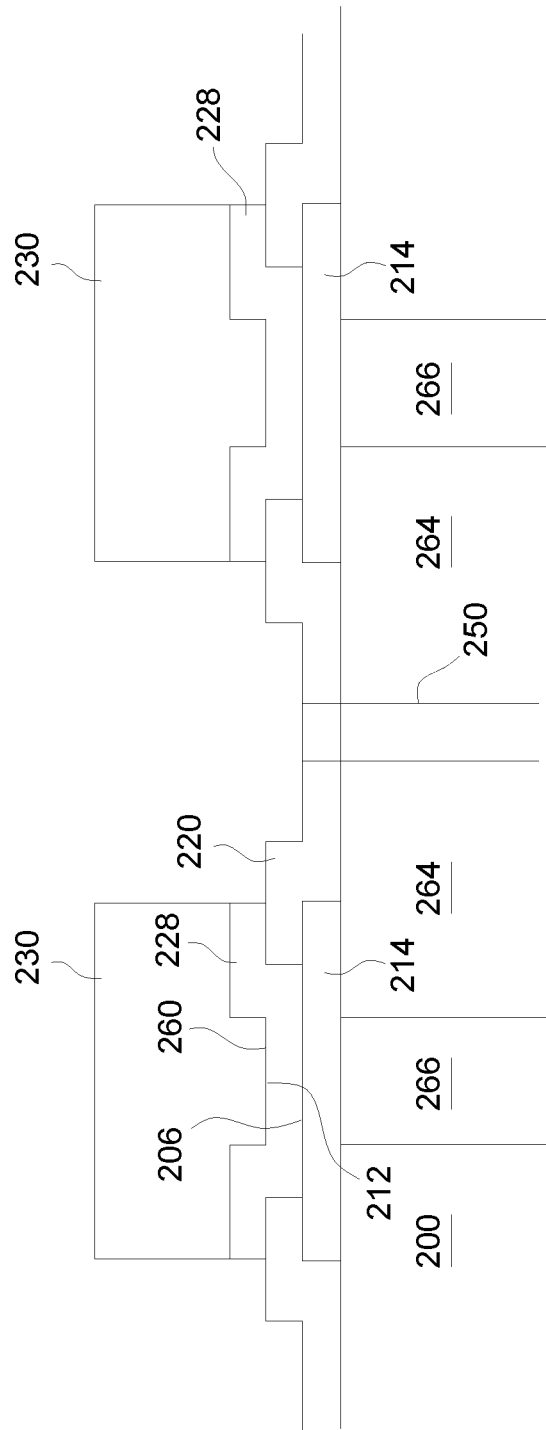

At operation 304, an optional underbump metal (UBM) layer 228 is formed on the conductive contact pad 214 exposed through the opening 204 formed through solder mask 220 as shown in FIG. 4B. At operation 306, a conductive pillar 230 is formed on the UBM layer 228 as shown in FIG. 4C. If the UBM layer 228 is not present, the conductive pillar 230 is formed directly on exposed top surface 206 of the contact pad 214 exposed through the opening 204 formed in the solder mask 220.

The conductive pillar 230 includes a bottom surface 260 that is formed directly on a surface 212 the UBM layer 228 facing away from the contact pad 214. Alternatively, the bottom surface 260 of the conductive pillar 230 may alternatively be formed directly on the exposed top surface 206 of the contact pad 214 in embodiments that do not include the UBM layer 228.

Figure 4D:
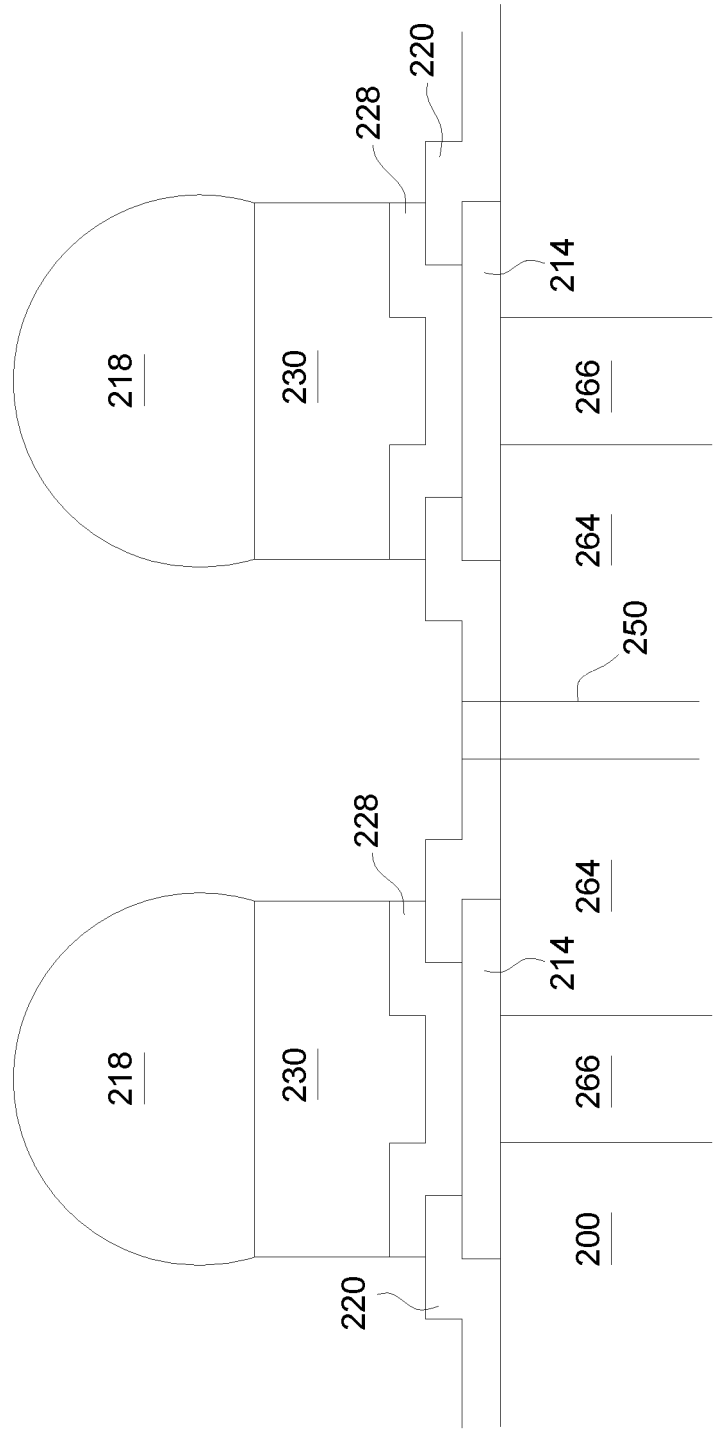

At operation 308, a solder ball 218 is deposited on the conductive pillar 230 coupled to the first circuitry of the IC die 264 formed on the first substrate 200, as illustrated in FIG. 4D. The solder ball 218 may be deposited by screen printing or other suitable technique.

Figure 4E:
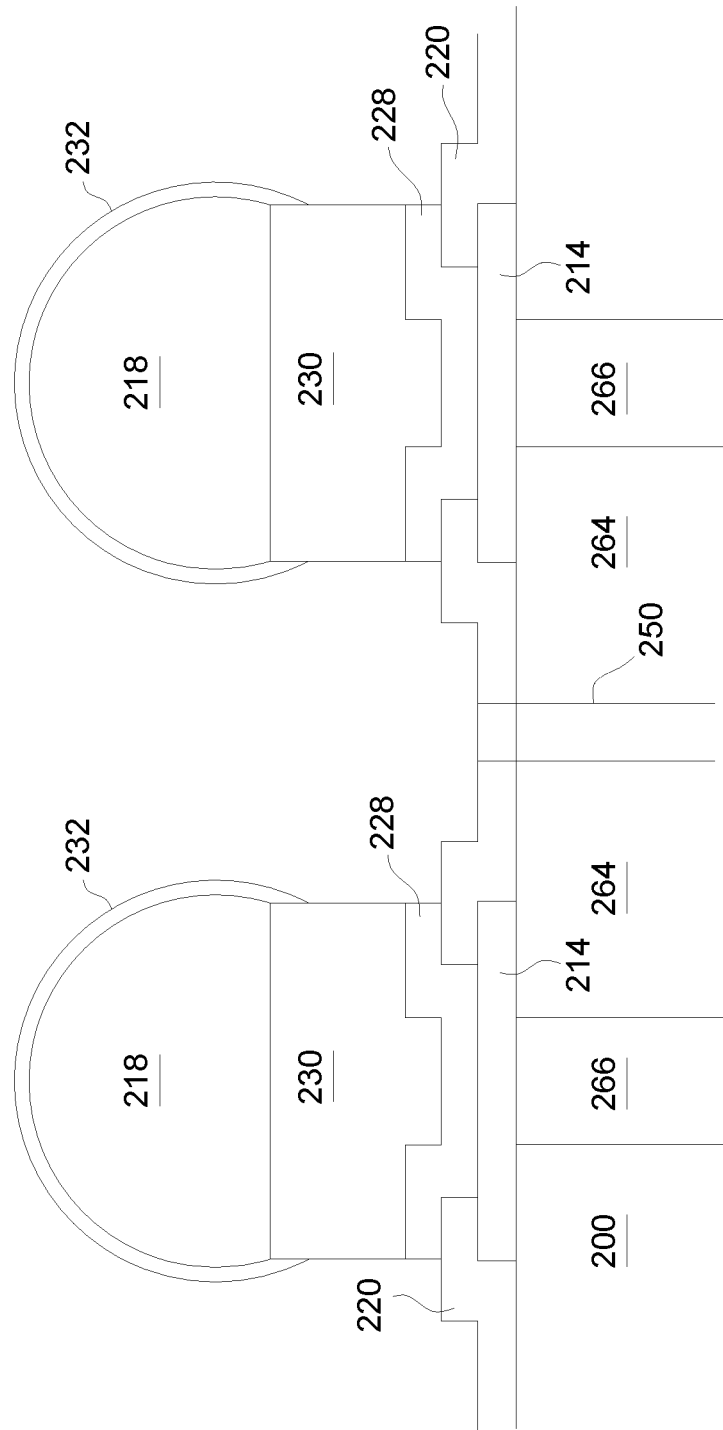

At operation 310, the solder balls 218 are exposed to an oxygen containing environment to form an oxidation layer (e.g., oxide coating) 232 on the solder balls, as illustrated in FIG. 4E. Operation 310 may be performed as described with reference to operation 110 above. In one example, the oxygen containing environment is an oxygen containing plasma. The oxygen containing environment forms a thick oxide coating (oxidation layer 232), such as $SnO_2$, uniformly around the solder ball. In one example, the oxidation layer 232 formed on the solder ball is at least 4 μm thick, such as between 5 μm and at least 7 μm thick. The oxidation layer 232 prevents native oxides from forming on the solder ball 218 which may detrimentally effect mechanical and electrical connections through the solder ball 218.

Figure 4F:
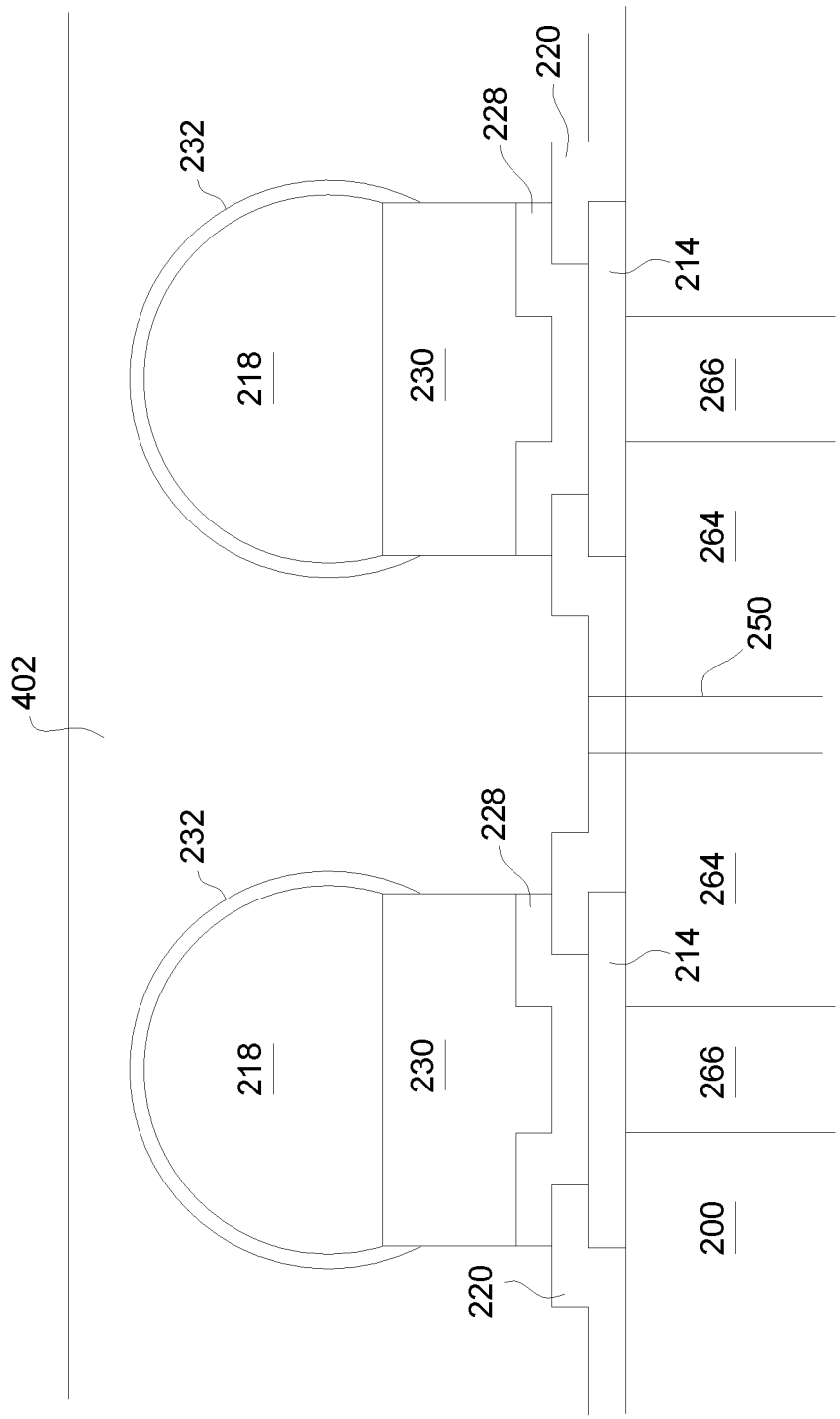

At operation 312, a removable protective coating 402 is disposed over the solder balls 218, as illustrated in FIG. 4F. For example, the removable protective coating 402 may be water-soluble. Suitable removal protective coatings are available from DISCO Corporation, headquartered in Ota-ku, Tokyo, Japan. In one example, the water-soluble protective coating 402 is HOGOMAX003™ coating. The water-soluble protective coating 402 may be applied, for example, by spin coating, or other suitable technique. It is contemplated that other types of protective coatings 402 may be alternatively utilized.

Figure 4G:
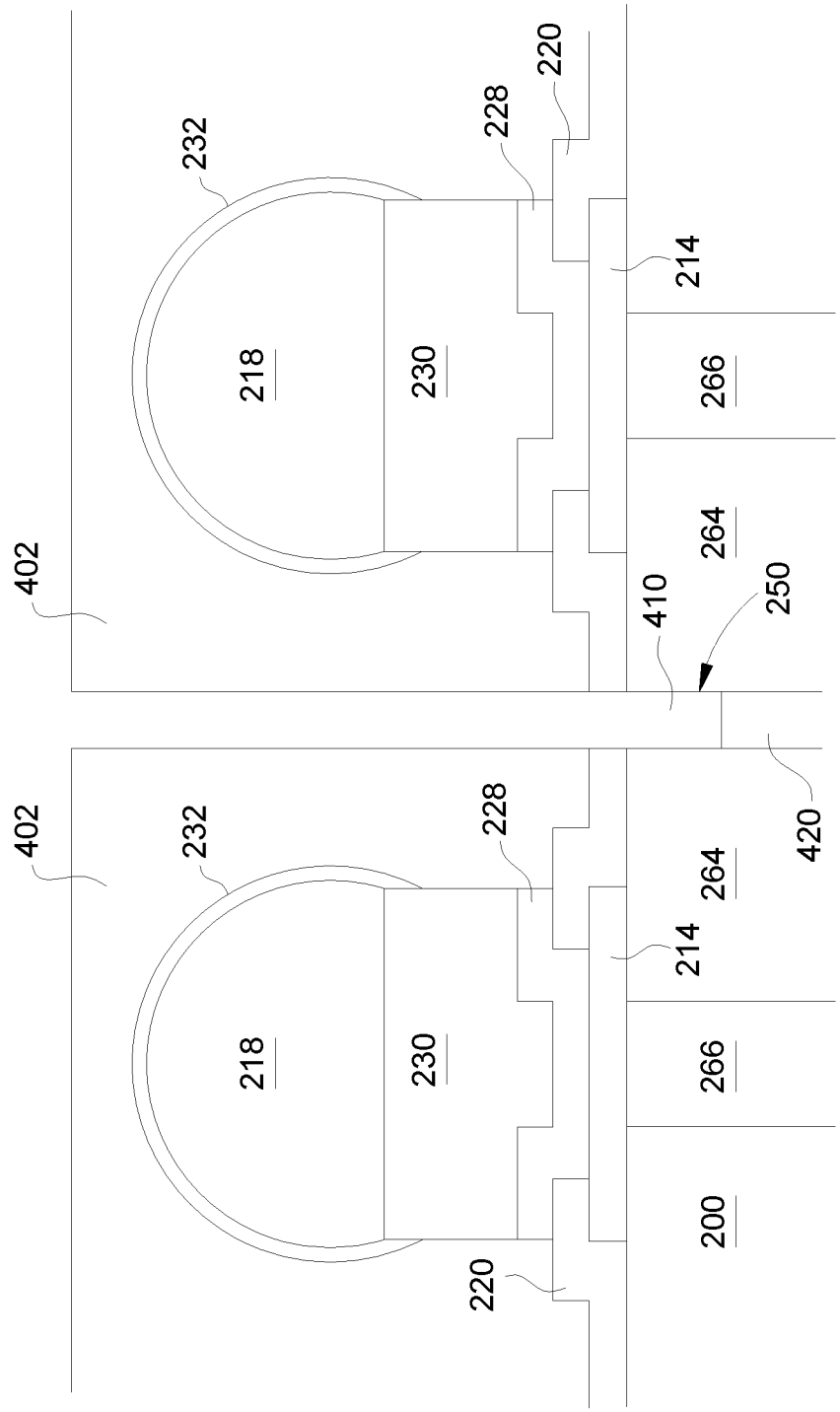

At operation 314, the first substrate 200 is partially diced along the scribe lane 250 to form a trench 410, as illustrated in FIG. 4G. The trench 410 extends through the protective coating 402, solder mask 220 and partially through the first substrate 200. A web of material 420 remains at the bottom of the trench 410 coupling the dice 264 on either side of the scribe lane 250 and preventing the first substrate 200 from being segmented in to separate pieces. At operation 314, the solder balls 218 remain encapsulated by the water-soluble protective coating 402. The trench 410 may be formed utilizing a laser, a mechanical cutting tool or other suitable technique. The water-soluble protective coating 402 protects the solder balls 218 from becoming contaminated during cutting of the first substrate 200 while forming the trench 410. Additionally, the water-soluble protective coating 402 prevents the first substrate 200 from becoming contaminated with debris from sawing and/or laser ablating which is difficult to remove from the surface of the first substrate 200.

Figure 4H:
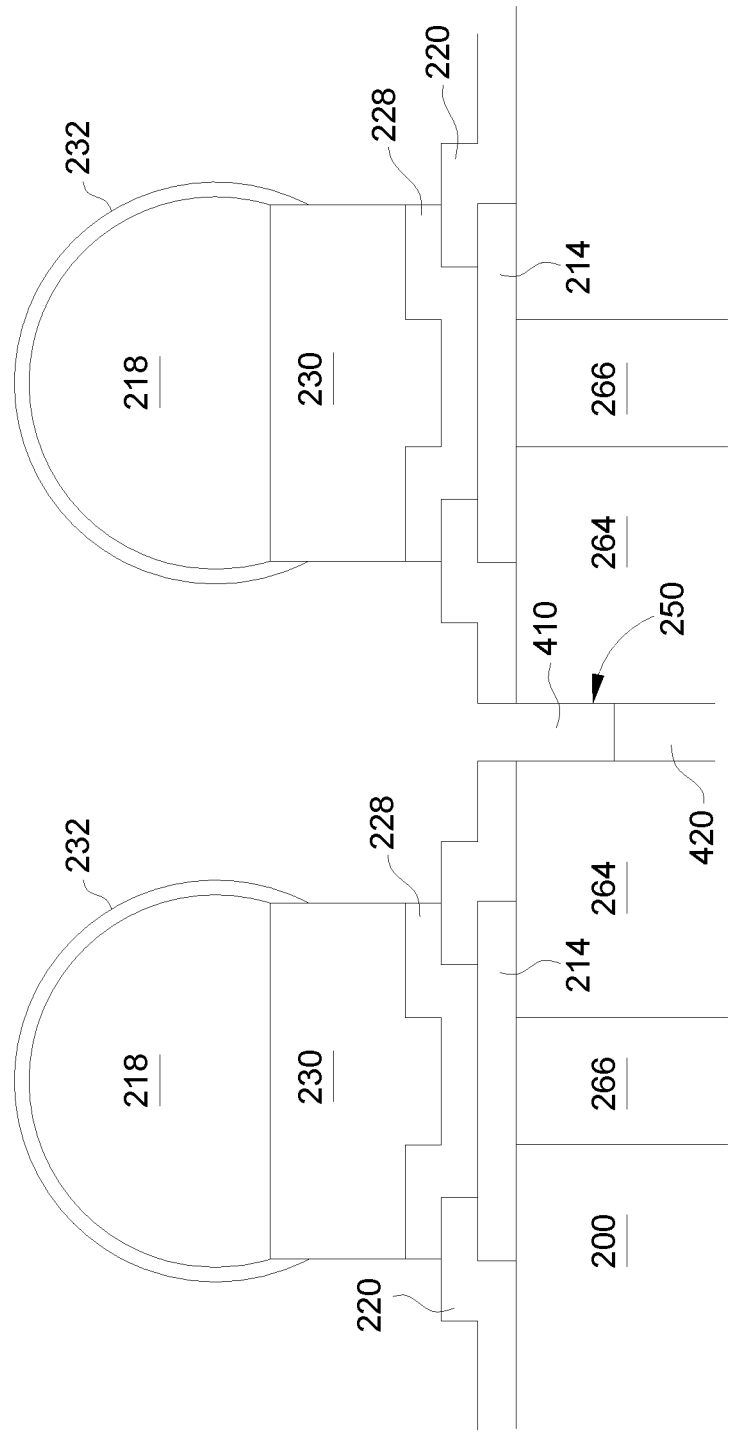

At operation 316, the water-soluble protective coating 402 is removed, as illustrated in FIG. 4H. The water-soluble protective coating 402 may be removed using a power washer, soaking in water, or by another suitable technique. Although the operation 310 that forms an oxidation layer 232 on the solder ball 218 is described occurring prior to operation 312, operation 310 may alternatively be performed after the water-soluble protective coating 402 is removed at operation 316.

At an optional operation 318, native oxides are removed from the solder balls 218 prior to forming the oxidation layer 232 at operation 310. The native oxides may be removed as described above with reference to operation 112. Operation 318 may be alternatively performed at another convenient stage of the method 300. By removing native oxides prior to the formation of the oxidation layer 232, a more robust and reliable electrical and mechanical interconnect is formed.

Figure 4I:
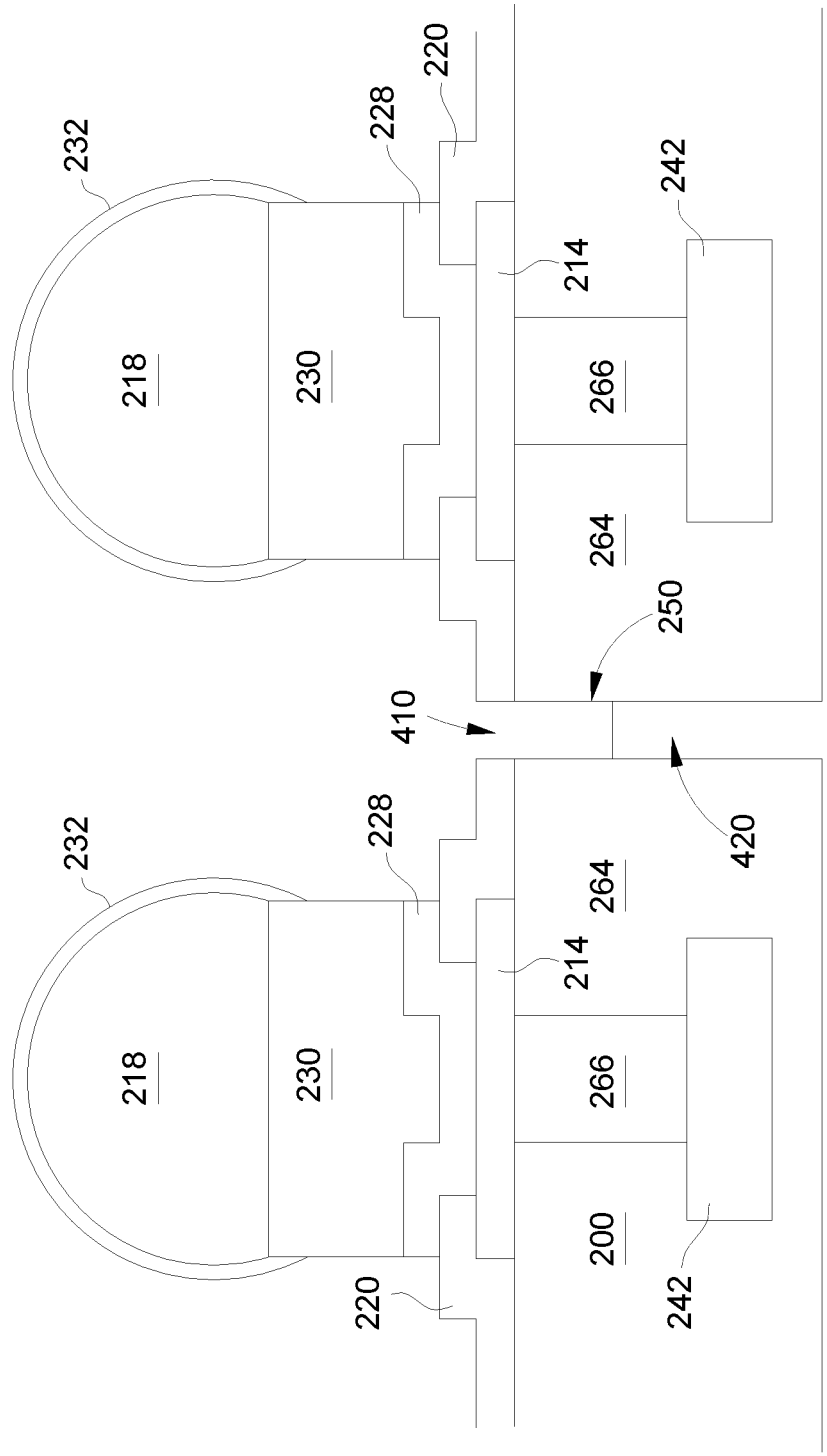

As illustrated in FIG. 4I, the dice 264 are diced at operation 320 by etching the web of material 420 of the first substrate 200 through the trench 410 in the scribe lane 250 formed at operation 310. The web of material 420, shown in phantom in FIG. 4I, may be etched away utilizing a dry plasma process. In one example, the dry plasma process utilizes a halogen containing gas, such as $XeF_2$, to etch the web of material 420 through the trench 410 and separate the dice 264 commonly disposed on the first substrate 200 across the scribe lane 250 into a plurality of separated, individual discrete dice 264 ready for packaging. $CF_4$ may be alternatively utilized to etch the web of material 420. The dry plasma process also converts the oxidation layer 232 on the solder balls 218 to a non-oxide solder protection layer 234 covering the solder balls 218, as illustrated in FIG. 4I. If operation 320 has been formed, then substantially no native oxides are present between the solder ball and non-oxide solder protection layer, which again provides a more robust and reliable electrical and mechanical interconnect.

The halogen containing gas may be energized while converting the oxidation layer 232 into the protection layer 234. For example, the halogen containing gas may be energized to form a plasma to disassociate the halogen containing gas. In one example, plasma is utilized to provide fluorine radicals to the surface of the oxidation layer 232. The fluorine radicals replace the oxygen elements within the oxidation layer 232, thus converting the oxidation layer to $SnF_N$ (e.g., the protection layer 234), where N is a positive integer.

The converted non-oxide solder protection layer 234 has a thickness of at least 3 µm thick, such as between 5 µm and at least 7 µm thick. The non-oxide solder protection layer 234 is conformal to the solder ball 218, and has a substantially uniform thickness (i.e., within ±3 µm). The non-oxide solder protection layer 234 prevents undesirable oxidation of the solder balls 218 during subsequent fabrication.

Alternatively, at operation 314, the first substrate 200 may be completely diced through the scribe line 250 to separate the dice 264. In such an example, after the protective coating 402 is removed at operation 316, operation 320 is only utilized to convert the oxidation layer 232 into the non-oxide solder protection layer 234 as the wafer 270 has already been diced.

At operation 322, the solder ball 218, coupled to first circuitry 242, formed in the first IC die 264 is attached to a second IC die 282, as illustrated in FIG. 4J. In the example depicted in FIG. 4J, the solder ball 218 coupled to first circuitry 242 of the first IC die 264 is attached to a solder ball 218 coupled to second circuitry 244 formed in the second IC die 282 formed on a second substrate 280 formed on a second wafer 272. At operation 322, the dice 264, 282 may be stacked and attached individually, or a plurality of diced first dice 264 may be reassembled as a reconstituted first substrate and simultaneously stacked and attached to a plurality of diced second dies 282 reassembled as a reconstituted second wafer.

At operation 324, the solder balls are reflowed to remove the non-oxide solder protection layer 234. The reflowing of the solder balls 218 additionally mechanically and electrically connects the first IC die 264 to the second IC die 282 as a solder interconnect 276, as illustrated in FIG. 4K. As the temperature is increased during the reflow process, the non-oxide solder protection layer is removed as the halogen elements within the non-oxide solder protection layer become volatile, leaving a clean, bare solder surface on the solder ball which upon reflowing of the solder ball, provides a robust electrical and mechanical connection between the first IC die and the second IC die.

Upon completion of operation 324, the stacked the first IC die and the second IC die may be mounted on a top surface of a package substrate utilizing solder balls to couple the circuitry of the dies with circuitry disposed within or on the package substrate to form a chip package, such as illustrated below with reference to FIG. 5. The chip package is tested, and then made available for use in an electronic device.

Figure 5:
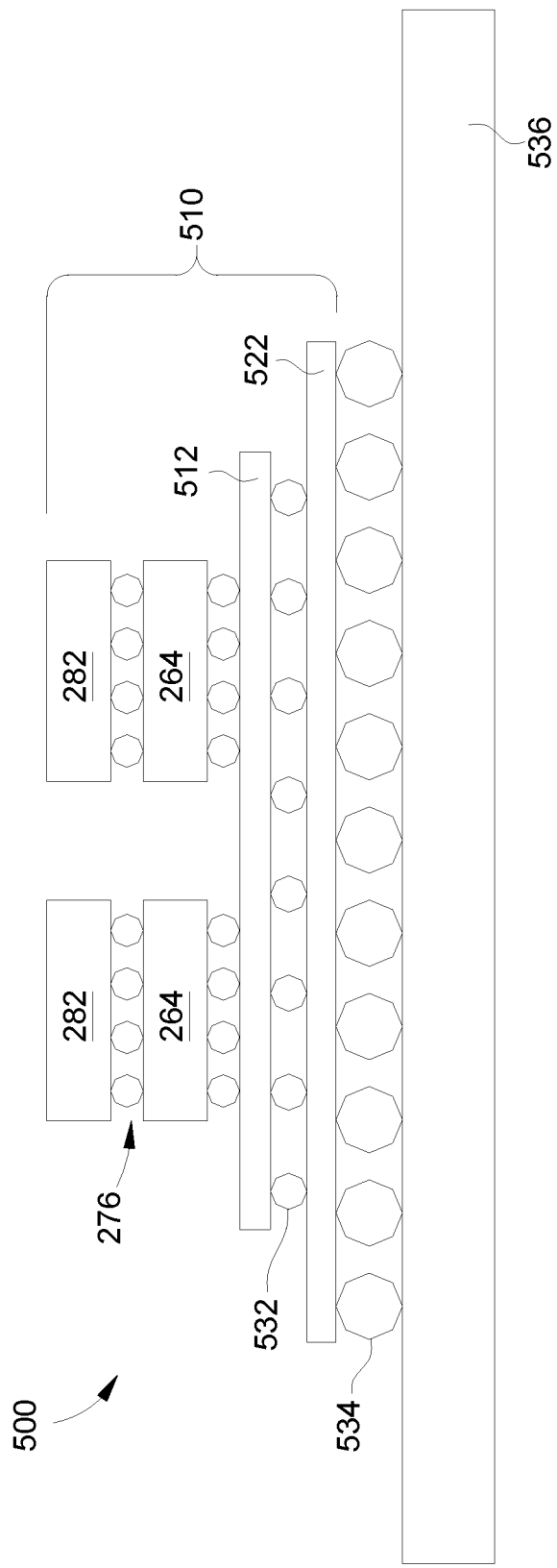
FIG. 5 is a schematic sectional view of an exemplary integrated circuit chip package fabricated in accordance to the novel technology disclosed below with reference to FIGS. 1-4K.

FIG. 5 is a schematic sectional view of an exemplary integrated circuit chip package 510 fabricated in accordance to the novel technology described above with reference to FIGS. 1-4H coupled to a printed circuit board (PCB) 536. The electronic device 500 may be a computer, tablet, cell phone, smart phone, consumer appliance, control system, automated teller machine, programmable logic controller, printer, copier, digital camera, television, monitor, stereo, radio, radar, or other device incorporating the chip package 510.

The chip package 510 includes a first integrated circuit (IC) die 264 stacked on a second IC die 282. The dice 264, 282 are fabricated as described above. Although only two dice 264, 282 are shown in FIG. 5, any desired number of dice may be utilized. The dice 264, 282 may be connected by an interposer 512 to a package substrate 522, or directly mounted on the package substrate 522. The chip package 510 may also have an overmold (not shown) covering the IC dice 264, 282. The interposer 512 may be a through-substrate-via (TSV) or a substrate-less interposer as commonly known in the art. The interposer 512 includes circuitry for electrically connecting the dice 264, 282 to circuitry of the package substrate 522. The circuitry of the interposer 512 may optionally include active or passive circuit elements.

The IC dice 264, 282 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 5, the IC dice 264, 282 are mounted to a top surface of the interposer 512 by a plurality of solder interconnects 276. The solder interconnects 276 electrically connect the circuitry 242, 244 of each IC die 264, 282 to the circuitry of the interposer 512.

A plurality of solder interconnects 532 are also utilized to form the electrical and mechanically connections between the circuitry of the interposer 512 and the circuitry of the package substrate 522. The solder interconnects 532 may be formed using solder balls, also known as "package bumps" or "C4 bumps," or may be formed as described with reference to the solder interconnects 276 described above. The package substrate 522 may be mounted and connected to the PCB 536 utilizing solder connections, wire bonding or other suitable technique. In the embodiment depicted in FIG. 5, the package substrate 522 is mounted to the PCB 536 using a plurality of solder balls 534.

The circuitry of the interposer 512 connects the solder interconnects 276 to selective solder interconnects 532, and hence, connects selective circuitry 242, 244 of each IC die 264, 282 to the package substrate 522, to enable communication of the dice 264, 282 with the PCB 536 after the chip package 510 is mounted within the electronic device 500. As discussed above, the solder interconnects 276 are configured to mechanically and electrically connect the interposer 512 with the IC die 264.

The solder interconnect 276 described above is particularly suitable for providing robust solder connections between the dice 264, 282, between die 264 and interposers 512. The solder interconnect 276 may also be utilized for providing robust solder connections between the dice 264, 282 and the package substrate 522 when not interposer is present. Advantageously, the solder interconnect 176 is resistant to oxidation and provides a uniform protective layer, which is readily removed during reflow. Moreover, the ability of the solder interconnect 176 to prevent oxidation enables flux-less soldering, which inhibits wicking of solder onto the pillar thereby making a more robust and reliable electrical and mechanical connection between dice. Moreover, as the protection layer 234 and dicing may be performed simultaneously while maintaining a clean and debris free substrate, cost and process time may be saved as compared to conventional solder interconnect and dicing processes.

While the foregoing is directed to embodiments of the present invention, other and further embodiments of the invention may be devised without departing from the basic scope thereof, and the scope thereof is determined by the claims that follow.

What is claimed is:

1. A method for forming an interconnect of an integrated circuit package, the method comprising:
depositing a solder ball on a pillar coupled to first circuitry formed in a first substrate;
exposing the solder ball to an oxygen containing environment to form a uniformly thick oxidation layer on the solder ball; and
converting the oxidation layer on the solder ball to a non-oxide solder protection layer.

2. The method of claim 1 further comprising;
attaching the first substrate to a second substrate; and
reflowing the solder ball to remove the non-oxide solder protection layer, and mechanically and electrically connect the first substrate to the second substrate.

3. The method of claim 1, wherein exposing the solder ball to an oxygen containing environment further comprises:
exposing the solder ball to an oxygen containing plasma.

4. The method of claim 3, wherein exposing the solder ball to an oxygen containing plasma further comprises:
forming a plasma from at least one of $O_2$ or ozone.

5. The method of claim 1, wherein converting the oxidation layer on the solder ball further comprises:
exposing the oxidation layer to a halogen containing plasma.

6. The method of claim 5, wherein exposing the oxidation layer to a halogen containing plasma further comprises:
etching through the substrate to separate a first IC die from a second IC die.

7. The method of claim 1 further comprising:
laser forming a trench in the substrate between a first IC die and a second IC die.

8. The method of claim 7 further comprising:
removing a protective coating covering the solder balls that was previously deposited over the solder balls prior to forming the oxidation layer.

9. The method of claim 7 further comprising:
removing a protective coating covering the solder balls that was previously deposited over the solder balls after forming the oxidation layer.

10. The method of claim 1 further comprising:
removing native oxides from the solder balls prior to exposing the solder ball to an oxygen containing environment to form the uniform thick the oxidation layer on the solder ball.

11. A method for forming an interconnect of an integrated circuit package, the method comprising:
depositing a solder ball on a pillar coupled to first circuitry of a first integrated circuit (IC) die formed in a first substrate;
exposing the solder ball to an oxygen containing environment to form an oxidation layer on the solder ball;
removing native oxides from the solder ball prior to exposing the solder ball to an oxygen containing environment to form the oxidation layer;
converting the oxidation layer on the solder ball to a non-oxide solder protection layer;
attaching the solder ball coupled to first circuitry formed in the first IC die to a second IC die; and
reflowing the solder ball to remove the non-oxide solder protection layer, and mechanically and electrically connect the first IC die to the second IC die.

12. The method of claim 11 further comprising:
depositing a protective coating over the solder ball;
forming a trench through the protective coating and into the first substrate;
removing the protective coating covering the solder ball; and
plasma etching the trench to separate the first IC die from an adjacent IC die.

13. The method of claim 12, wherein converting the oxidation layer on the solder ball to form a non-oxide solder protection layer and plasma etching the trench occur simultaneously in the presence of a halogen containing gas.

14. A method for forming an interconnect of an integrated circuit package, the method comprising:

depositing a solder ball on a pillar coupled to first circuitry formed in a first substrate;

exposing the solder ball to an oxygen containing environment to form an oxidation layer on the solder ball;

removing native oxides from the solder balls prior to exposing the solder ball to an oxygen containing environment to form the oxidation layer on the solder ball; and converting the oxidation layer on the solder ball to a non-oxide solder protection layer.

15. The method of claim 14 further comprising;

attaching the first substrate to a second substrate; and reflowing the solder ball to remove the non-oxide solder protection layer, and mechanically and electrically connect the first substrate to the second substrate.

16. The method of claim 14, wherein exposing the solder ball to an oxygen containing environment further comprises:

exposing the solder ball to an oxygen containing plasma.

17. The method of claim 14, wherein converting the oxidation layer on the solder ball further comprises:

exposing the oxidation layer to a halogen containing plasma.

18. The method of claim 17, wherein exposing the oxidation layer to a halogen containing plasma further comprises:

etching through the substrate to separate a first IC die from a second IC die.

19. The method of claim 14 further comprising:

laser forming a trench in the substrate between a first IC die and a second IC die.

20. The method of claim 1, wherein exposing the solder ball to an oxygen containing environment to form the uniform thick oxidation layer on the solder ball further comprises:

forming the uniform thick oxidation layer on the solder ball that is at least 4 µm thick.

* * * * *